United States Patent
Wentink

(10) Patent No.: US 6,924,696 B2
(45) Date of Patent: Aug. 2, 2005

(54) METHOD AND APPARATUS FOR COMMON-MODE LEVEL SHIFTING

(75) Inventor: Robert S. Wentink, Lino Lakes, MN (US)

(73) Assignee: Honeywell International Inc., Morristown, NJ (US)

( * ) Notice: Subject to any disclaimer, the term of this patent is extended or adjusted under 35 U.S.C. 154(b) by 16 days.

(21) Appl. No.: 10/624,117

(22) Filed: Jul. 21, 2003

(65) Prior Publication Data

US 2004/0080365 A1 Apr. 29, 2004

Related U.S. Application Data

(60) Provisional application No. 60/398,629, filed on Jul. 25, 2002.

(51) Int. Cl.[7] .................................................. H03F 3/45
(52) U.S. Cl. ....................................... 330/69; 330/258
(58) Field of Search ......................... 330/69, 252, 256, 330/257, 258, 260; 327/359

(56) References Cited

U.S. PATENT DOCUMENTS

| | | | |
|---|---|---|---|
| 3,875,523 A | * | 4/1975 | Wade et al. ................. 330/69 |
| 4,162,456 A | * | 7/1979 | Lukes .......................... 330/69 |
| 5,517,134 A | | 5/1996 | Yaklin .......................... 327/65 |
| 6,087,820 A | | 7/2000 | Houghton et al. .......... 323/315 |
| 6,259,300 B1 | | 7/2001 | Yasuda et al. .............. 327/333 |
| 6,259,322 B1 | | 7/2001 | Muza .......................... 330/257 |
| 6,507,223 B2 | * | 1/2003 | Felder ......................... 327/77 |
| 2001/0021813 A1 | | 9/2001 | Yonce .......................... 600/509 |

OTHER PUBLICATIONS

PCT International Search Report for Honeywell International, Inc., PCT/US 03/23390, dated Jul. 15, 2004.

* cited by examiner

Primary Examiner—Henry Choe
(74) Attorney, Agent, or Firm—McDonnell Boehnen Hulbert & Berghoff LLP

(57) ABSTRACT

A circuit in accordance with the invention comprises a differential amplifier; and a direct current (DC) source coupled with the differential amplifier. The DC source generates a direct current that is communicated in substantially predetermined portions to multiple inverting input terminals of the differential amplifier. The direct current is applied so as to shift a common-mode voltage of electrical signals that are processed by the differential amplifier. The shift in the common-mode voltage is proportional to the direct current generated by the DC source.

28 Claims, 4 Drawing Sheets

METHOD AND APPARATUS FOR COMMON-MODE LEVEL SHIFTING

CROSS REFERENCE TO RELATED APPLICATIONS

This application claims the benefit under 35 U.S.C. § 120 to U.S. Provisional Application Ser. No. 60/398,629, filed Jul. 25, 2002.

FIELD

The present invention relates to analog signal-processing circuits and, more particularly, to adjusting common-mode voltages in such analog signal-processing circuits.

BACKGROUND

Analog/differential circuits have numerous applications in varying areas of technologies. For example, differential amplifiers may be used in radio transmitters and receivers, in analog-to-digital converters, in semiconductor memory arrays, among numerous other applications. One application of such differential circuits that is becoming increasingly important is the area of single component (or semiconductor chip) radios, particularly those implementing direct conversion radio architectures. These direct conversion architectures, as is known, often implement a number of fully differential circuit stages. These fully differential circuit stages are typically sensitive to electrical noise. In this respect, any noise referred onto these signals is highly undesirable as each differential stage amplifies the signal (and noise) that it receives at its differential inputs.

In order to reduce the amount of noise referred, such differential signals are not typically referenced to ground and are "carried" on a common-mode voltage signal, which takes the form of a direct current (DC) voltage signal. This reduces the reference of electrical ground noise on to the differential signals. In the context of direct conversion radios, the common-mode voltages of different circuit stages are often quite different. In this regard, a radio frequency stage in such radio architectures may employ a different common mode voltage than a baseband stage. Such circuit stages are known to those working in this area and are not explained in detail here. In such applications, signals produced by circuit stages that have different common mode voltages are not compatible without first changing the common-mode voltage of one or more of the signals. In this regard, any such signals being processed by the same circuit stage typically have the same common-mode voltage. Adjusting such common-mode voltages is typically accomplished by employing a separate (additional) circuit stage to shift the common-mode voltage(s) of such signals.

Such an approach, however, has certain disadvantages. For example, such circuits typically convert differential signals being processed to single ended signals to accomplish such common-mode voltage shifts. These current approaches then typically use voltage follower circuits to apply such shifts. However, voltage follower circuits consume a relatively large amount of power (which is in addition to the noise created by the differential amplifier) and add noise to the signals being processed. Thus, such voltage follower circuits may degrade the quality of signal processing for circuits in which they are employed while consuming more power. Also, using a separate circuit stage to apply a common-mode voltage shift introduces additional circuit delay, which impacts the efficiency of circuits employing such techniques. Therefore, based on the foregoing, alternative approaches for applying a common-mode voltage shift are desirable.

SUMMARY

A circuit in accordance with the invention comprises a differential amplifier; and a direct current (DC) source coupled with the differential amplifier. The DC source generates a direct current that is communicated in substantially predetermined portions to multiple inverting input terminals of the differential amplifier. The direct current is applied so as to shift a common-mode voltage of electrical signals that are processed by the differential amplifier. The shift in the common-mode voltage is proportional to the direct current generated by the DC source.

BRIEF DESCRIPTION OF THE DRAWINGS

The subject matter regarded as the invention is particularly pointed out and distinctly claimed in the concluding portion of the specification. The invention, however, as to both organization and method of operation, together with features and advantages thereof, may best be understood by reference to the following detailed description when read with the accompanying drawings in which:

DETAILED DESCRIPTION

In the following detailed description, numerous specific details are set forth in order to provide a thorough understanding of the invention. However, it will be understood that the present invention may be practiced without these specific details. In other instances, well-known methods, procedures, components and circuits have not been described in detail, so as not to obscure the present invention.

Figure 1:
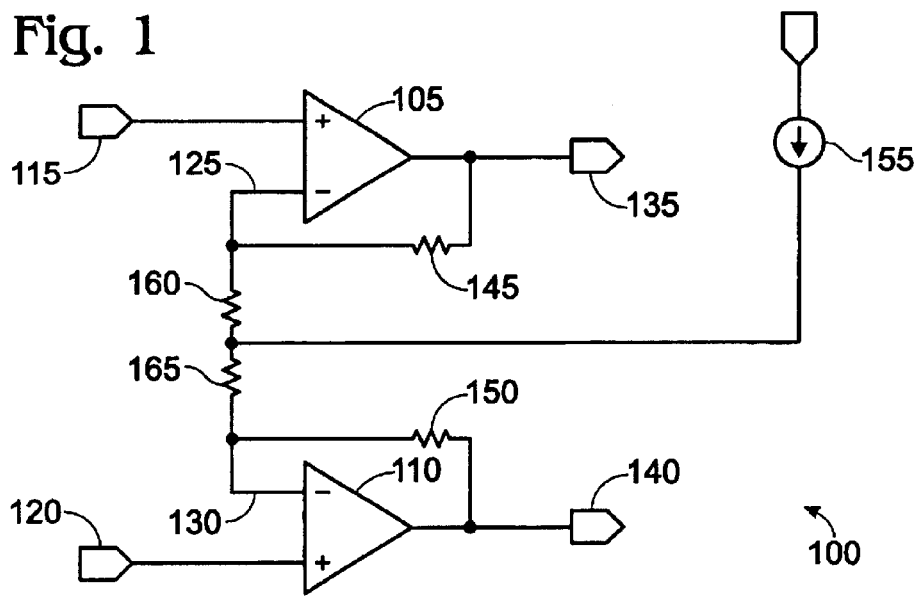
FIG. 1 is a schematic drawing of a differential amplifier circuit with common-common mode shifting in accordance with an exemplary embodiment of the invention.

Referring now to FIG. 1, a schematic diagram illustrating a fully differential amplifier circuit 100 in accordance with an exemplary embodiment of the invention is shown. The amplifier 100 may address at least some of the foregoing disadvantages associated with current approaches for shifting common-mode voltages.

The amplifier 100 comprises differential comparators 105 and 110. The differential comparators 105 and 110 each include a non-inverting input terminal; respectively 115 and 120, as well as an inverting input terminal; respectively 125 and 130. The differential comparators 105 and 110 also include respective output terminals 135 and 140. As may be seen in FIG. 1, the output terminals 135 and 140 are coupled with the inverting input terminals 125 and 130 via, respectively, resistors 145 and 150. Such feedback configurations are known. For this particular embodiment, the resistors 145 and 150 are of substantially the same resistance value. Further, for this embodiment, the differential comparators 105 and 110 have substantially similar electrical characteristics.

The amplifier 100 also comprises a direct current (DC) current source 155 that supplies a substantially constant DC current. It will be appreciated that any number of various DC current sources may be used. However, it is preferable that the current source 155 is of a type that the current generated by the current source 155 is substantially constant over the operating temperature range of a circuit in which the amplifier 100 is employed. While the invention is not limited in scope to the particular embodiments described herein, one such current source configuration will be discussed with respect to FIG. 3.

The current source 155 is coupled with the non-inverting inputs 125 and 130 of the differential comparators 105 and 110 via respective resistors 160 and 165. The resistors 160 and 165 are of substantially the same resistance value as each other. In this respect, the resistors form a symmetric divider circuit, which divides the current supplied by current source 155 in substantially equal portions. The current generated by the current source and communicated to the differential comparators 105 and 110 results in the common-mode voltage of signals being processed by the amplifier 100 to be shifted by an amount that is proportional to the amount of current generated by the current source 155. Thus, the amplifier 100 applies a common-mode voltage shift by applying current to the inverting inputs of differential comparators 105 and 110 without using an additional logic stage. Because a separate circuit stage is not used to apply common-mode voltage shifts to signals processed by the amplifier 100, the amplifier 100 may consume less power and have less noise introduced into a signal processing circuit path in which it is employed than prior circuits, such as those using voltage follower circuits. Furthermore, different common-mode voltage shifts may be realized by applying different amounts of current to the differential comparators of the amplifier 100, as will be discussed in further detail with respect to FIG. 2.

Figure 2:
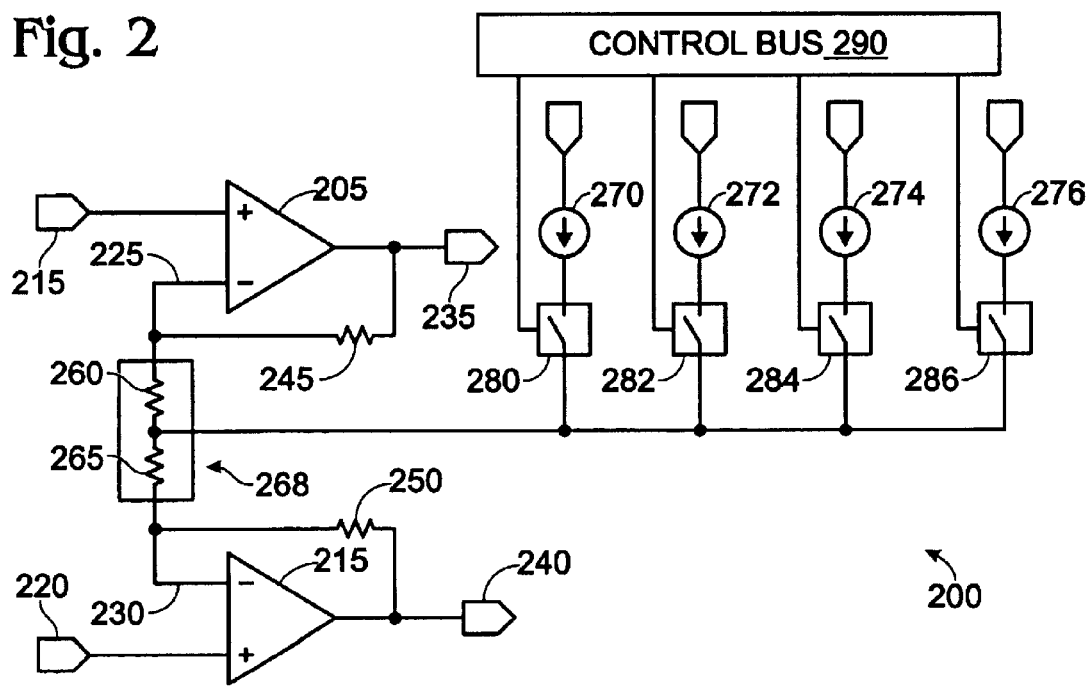
FIG. 2 is a schematic drawing of another differential amplifier circuit with common mode shifting in accordance with an alternative exemplary embodiment of the invention.

Referring now to FIG. 2, a schematic diagram that illustrates a differential amplifier circuit 200 in accordance with another exemplary embodiment of the invention is shown. The amplifier 200 comprises circuit components 205–250, 260 and 265, which are respectively analogous with the circuit components 105–150, 160 and 165 of the amplifier 100 shown in FIG. 1. For the sake of brevity, these components will not be described again with respect to FIG. 2 except to the extent needed to describe the amplifier 200.

The amplifier 200 also comprises multiple DC current sources 270, 272, 274 and 276. These current sources are coupled in parallel with each other and further coupled, via respective switching elements 280, 282, 284 and 286, with a resistor divider 268 that comprises the resistors 260 and 265. These switching elements may be any appropriate electrical switch, such as, without limitation, field effect transistors. The switching elements 280–286 are further coupled with control bus 290. In this respect, control bus 290 may selectively couple the current sources 270–276 with the resistor divider 268 by opening and/or closing individual switching elements of the switching elements 280–286. In this regard, the amount of current applied to the resistor divider 268 may be varied as a result of the number of current sources that are coupled with the resistor divider 268. It will be appreciated that fewer, or additional current sources may be included in the amplifier 200. These current sources may be coupled with the control bust 290 and the resistor divider 268 in a similar fashion as is illustrated for current sources 270–276 in FIG. 2.

For the amplifier 200, the current sources 270–276 may be configured to provide substantially equal currents. Alternatively, the current sources 270–276 may be configured to provide differing current amounts, such as weighted currents. As an example, the current source 270 may be configured to provide 1 milliamp (ma) of current; the current source 272 may configured to provide 2 ma of current; the current source 274 may be configured to provide 4 ma of current; and the current source 276 may be configured to provide 8 ma of current. Such an approach provides greater resolution in the current that may be communicated (via the resistor divider 268) to the inverting inputs 225 and 230 of the amplifier 200, as compared with embodiments where a single current supply is used, or where the same current is supplied by each current source. It will be appreciated that the current values discussed above are exemplary, and other current values may be used in addition to employing fewer, or additional current sources.

Figure 3:
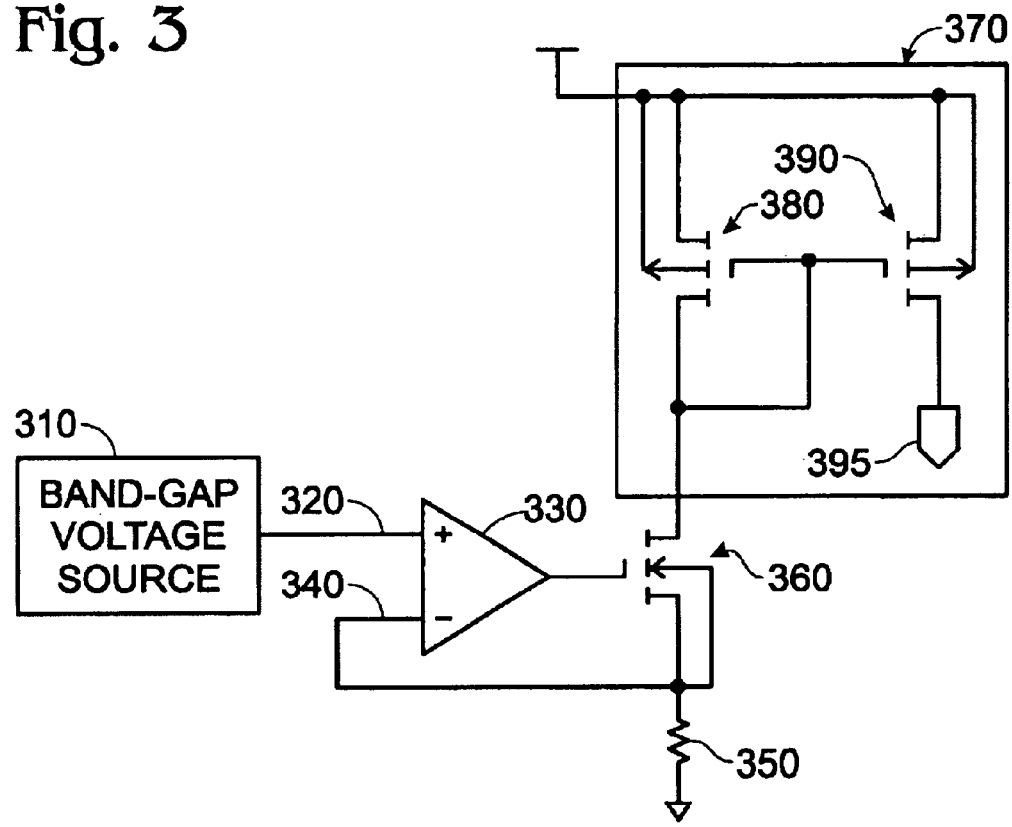
FIG. 3 is a schematic diagram of a band-gap referenced current source that may be employed with the exemplary embodiments of differential amplifier circuits shown in FIGS. 2 and 3.

As was previously noted, any number of different types of current sources may be employed in the amplifiers 100 and 200 shown in FIGS. 1 and 2, with substantially temperature independent current sources being preferable. In this respect, FIG. 3 is a schematic diagram that illustrates a known configuration of a substantially temperature independent current source 300.

The current source 300 comprises a band-gap voltage source 310. Such voltage sources are known and typically include a semiconductor device from which a band-gap reference voltage is obtained. Such a voltage is substantially constant over a broad temperature range and, therefore, provides a substantially temperature independent reference on which a current generated by current source 300 is based. The band gap voltage source 310 is coupled with a non-inverting input terminal 320 of a differential comparator 330. An inverting input 340 of the differential comparator 330 is coupled in a feedback configuration with a resistor 350 that is further coupled to ground and to a semiconductor device 360. For this embodiment, the semiconductor device 360 acts as a transconducting device and takes the form or a field effect transistor. Alternatively, the semiconductor device 360 may take the form of bipolar transistor, or any other controllable transconducting device.

For this embodiment, the resistor 350 takes the form of a substantially temperature independent precision resistor. The output signal generated by the differential comparator 330 (in the shown feedback configuration with the band-gap reference 310 coupled to the non-inverting input terminal 320), in combination the resistor 350 and the semiconductor device 360, acts as a substantially temperature independent, stable current reference. This current reference is then applied to a current mirror 370 (which comprises transistors 380 and 390). The current mirror 370, then supplies a stable current (via output terminal 395) that may be employed to shift common-mode voltages, as has been previously described. In this respect, various configurations of the current source 300 may be employed to provide varying current values, such as was described with respect to the current sources 270–276 of the amplifier 200.

The operation of the exemplary amplifiers 100 and 200 shown in FIGS. 1 and 2 may be further illustrated with reference to FIGS. 4A–4C, which are timing diagrams illustrating various relationships of electrical signals that may be processed and/or produced by those amplifiers.

While either amplifier 100 or 200 may produce these signals, the timing diagrams in FIGS. 4A–4C will be discussed with respect to the amplifier 100 shown in FIG. 1. It will be appreciated that the signals illustrated in FIGS. 4A–4C may be produced and/or processed in similar fashion by the amplifier 200, shown in FIG. 2.

Figure 4A:
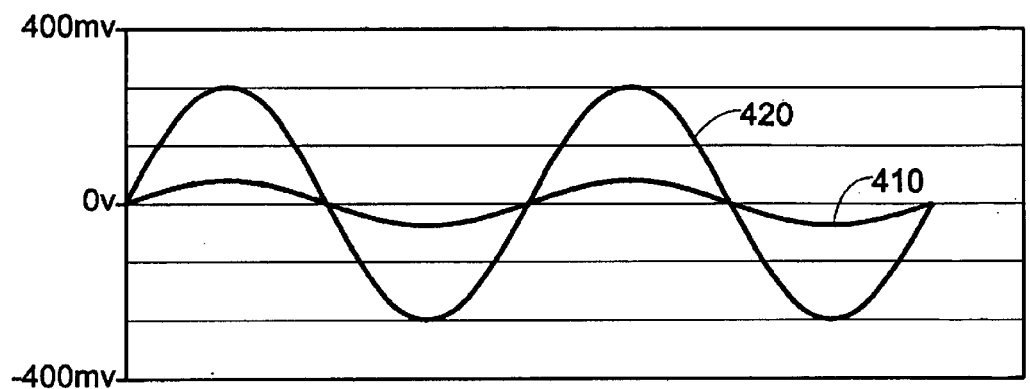
FIGS. 4A–4C are timing diagrams illustrating the relationship of electrical signals processed and/or produced by the exemplary circuits of FIG. 2 and/or FIG. 3.

FIG. 4A illustrates the relationship between a differential input signal 410 that is applied to the non-inverting inputs 115 and 120 of the amplifier 100 and a corresponding output signal 420 that is produced by the differential amplifier 100 and communicated on output terminals 135 and 140. As may be seen in FIG. 4A, the input signal 410 and the output signal 420 are substantially in phase and the output signal 420 is an amplified version of the input signal 410. It is noted that in FIG. 4A the input signal 410 and the output signal 420 are only the differential components of those signals and, therefore, do not show the common mode component of those signals. FIG. 4A is provided to illustrate the relationship between differential input signals processed by the differential amplifier 100 and associated differential output signals produced by the amplifier 100 without consideration of common mode shift.

Figure 4B:
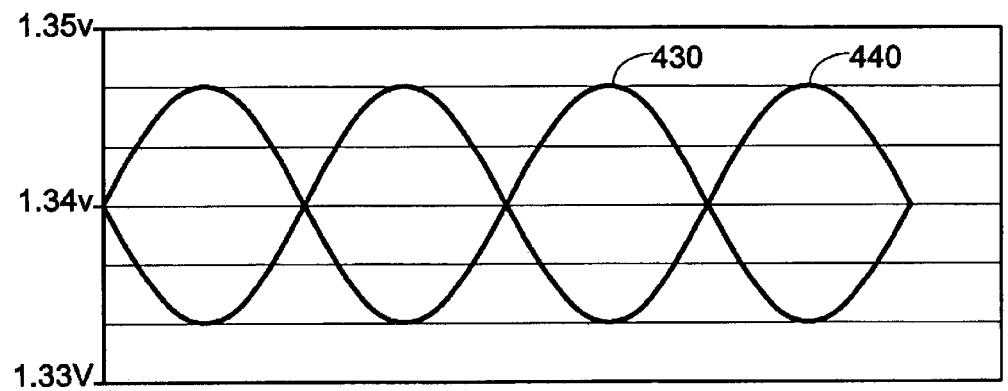

FIG. 4B illustrates the relationship of both phases of differential input signals that may be processed by the amplifier 100. In this regard, an input signal 430 may be applied to the non-inverting input 115 of the amplifier 105. Similarly, an input signal 440, which is 180 degrees out of phase with the input signal 430, may be applied to the non-inverting input 120 of the amplifier 110. As may be seen in FIG. 4B, the input signals 430 and 440 have a common-mode voltage of 1.34V. The input signals 430 and 440 may then be processed by the amplifier 100 and a common mode voltage shift may be achieved by communicating a current from the current source 155 to the inverting inputs 125 and 130 via then resistors 160 and 165, as was discussed above.

Figure 4C:
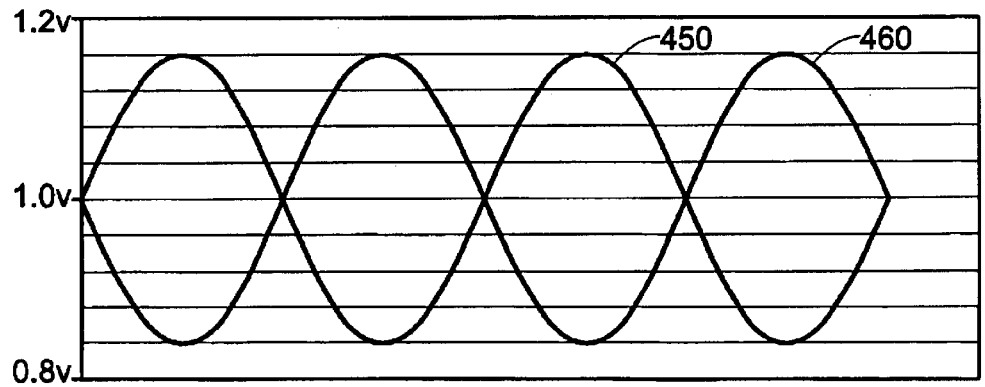

In this regard, FIG. 4C illustrates the relationship of two phases of output signals (respectively 450 and 460) associated with the input signals 430 and 440 when processed by the amplifier 100 in the foregoing manner. The output signal 450 corresponds with the input signal 430 and has substantially the same phase and is an amplified version of the input signal 430. Likewise, he output signal 460 corresponds with the input signal 440 and has substantially the same phase and is an amplified version of the input signal 440. However, as may be seen in FIG. 4C, the common-mode voltage of the output signals 450 and 460 is shifted from the 1.34 V common-mode voltage of the input signals 430 and 440 to a 1.0 V common-mode voltage as a result of the current supplied by current source 155.

Figure 5:
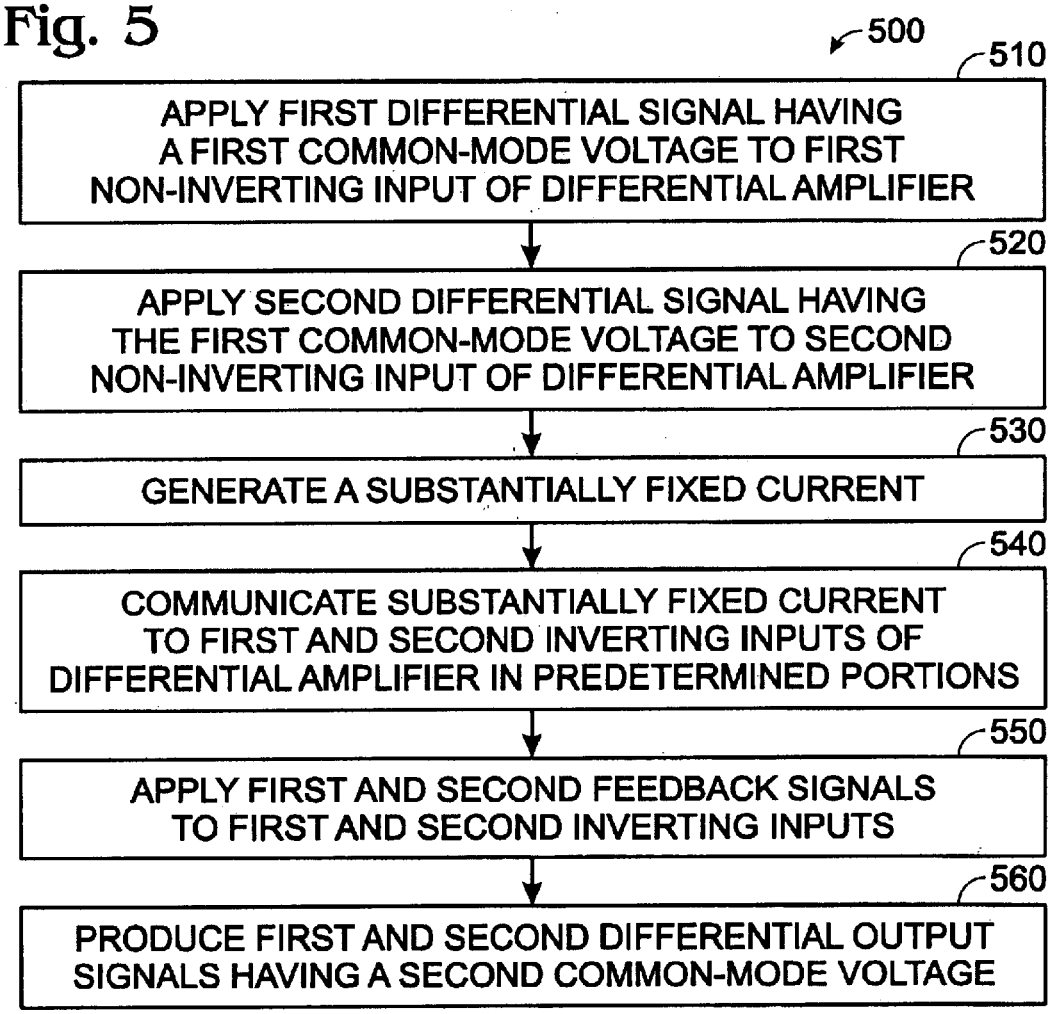
FIG. 5 is a flowchart illustrating a method of shifting the common mode voltage of analog signals being processed by a differential circuit in accordance with and exemplary embodiment of the invention.

Referring now to FIG. 5, a flowchart illustrating a method 500 for shifting a common-mode voltage of electrical signals processed by an amplifier in accordance with an exemplary embodiment of the invention is shown. The method 500 may be implemented using either of the amplifiers 100 or 200 shown, respectively, in FIGS. 1 and 2. At block 510, the method comprises applying a first differential signal having a first common mode voltage to a first non-inverting input of a differential amplifier. At block 520, the method includes applying a second differential signal having the first common-mode voltage to a second non-inverting input of the differential amplifier. These signal may be signals such the input signals 430 and 440, as shown in FIG. 4B, though the invention is not so limited.

At block 530, the method 500 comprises generating a substantially fixed current. The current generated at block 530 may be generated in any number of ways, such as those described above with reference to FIGS. 1–3. As was discussed above, it is preferable that the substantially fixed current generated at block 530 is substantially temperature independent, so as to improve the accuracy of circuits implementing the method 500. At block 540, the substantially fixed current generated at block 530 is communicated to first and second inverting inputs of the differential amplifier. As was described above, this current may be communicated to the inverting inputs in substantially equal portions via a resistor divider circuit. At block 550, the method 500 includes applying feedback signals from differential outputs of the amplifier to the inverting inputs of the amplifier, which may be done via resistors as was previously described.

At block 560, the method 500 comprises producing first and second differential output signals having a second common-mode voltage. Such output signals may be signals such the output signals 450 and 460, as shown in FIG. 4C, though the invention is not so limited. The second common-mode voltage of the output signals, as has been discussed above, differs from the first common-mode voltage of the input signals by an amount that is proportional to the current generated at block 530 and communicated to the inverting inputs of the amplifier at 540.

While certain features of the invention have been illustrated and described herein, many modifications, substitutions, changes and equivalents will now occur to those skilled in the art. The embodiments discussed herein, and their applications are exemplary and other embodiments and applications within the scope of the invention exist. For example, embodiments of the invention may be employed to directly interface any number of different analog circuit blocks with different common mode voltages. Such applications include, without limitation, interfacing one differential amplifier to another, interfacing a differential amplifier to a limiter, or interfacing a differential amplifier with an analog-to-digital converter (ADC), among other combinations. As another example, embodiments of the invention may be used to move the linear range of an ADC by shifting a common-mode voltage. Therefore, based on the foregoing, it is to be understood that the appended claims are intended to cover all such modifications and changes as fall within the true spirit of the invention.

What is claimed is:

1. A circuit comprising:
   a differential amplifier; and
   a direct current (DC) source coupled with the differential amplifier, wherein a direct current generated by the DC source is communicated in substantially predetermined portions to plural inverting input terminals of the fully-differential amplifier so as to shift a common-mode voltage of one or more electrical signals processed by the fully-differential amplifier by a substantially predetermined amount.

2. The circuit of claim 1, wherein the differential amplifier comprises:
   a first operational amplifier having a first inverting input terminal of the plural inverting input terminals, a first non-inverting input terminal and a first output terminal, wherein the first output terminal is coupled with the first inverting input terminal via a first resistor of a first resistance value;
   a second operational amplifier having a second inverting input terminal of the plural inverting input terminals, a second non-inverting input terminal and a second output terminal, wherein the second output terminal is coupled with the second inverting input terminal via a second resistor of substantially the first resistance value, wherein the first and second inverting inputs are further coupled via a third resistor and a fourth resistor coupled in series, the third and fourth resistors both being of a substantially same second resistance value.

3. The circuit of claim 2, wherein an output terminal of the DC source is coupled with the differential amplifier between the third and fourth resistors.

4. The circuit of claim 1, wherein the DC source generates a substantially fixed current over a predetermined temperature range.

5. The circuit of claim 1, wherein the DC source comprises a plurality of selectable DC sources coupled in parallel with the differential amplifier.

6. The circuit of claim 5, wherein the plurality of DC sources comprises a plurality of DC sources that generate approximately equivalent direct currents.

7. The circuit of claim 5, wherein the plurality of DC sources comprises a plurality of DC sources that generate weighted direct currents.

8. The circuit of claim 1, wherein the DC source comprises:
a band-gap voltage source;
an operational amplifier having a non-inverting input terminal coupled with the voltage source;
a substantially temperature independent precision resistor coupled with an inverting input terminal of the operational amplifier and an electrical ground;
a transconducting device coupled with an output terminal of the operational amplifier and the precision resistor; and
a current mirror circuit coupled with the transconducting device, wherein an output terminal of the current mirror circuit is coupled with the differential amplifier.

9. The circuit of claim 1, wherein the electrical signals comprise radio frequency signals.

10. The circuit of claim 1, wherein the electrical signals comprise baseband signals.

11. A fully differential amplifier circuit comprising:
a first operational amplifier having a first non-inverting input terminal, a first inverting input terminal and a first output terminal, wherein the first output terminal is coupled with the first inverting input terminal via a first resistor of a first resistance value;
a second operational amplifier having a second non-inverting input terminal, a second inverting input terminal and a second output terminal, wherein the second output terminal is coupled with the second inverting input terminal via a second resistor of substantially the first resistance value, and the first and second inverting inputs are coupled via a third resistor and a fourth resistor coupled in series, the third and fourth resistors both being of a substantially same second resistance value; and
a direct current (DC) source having a current output terminal coupled with, and between the third and fourth resistors, the DC source providing a direct current for shifting a common-mode voltage of one or more electrical signals processed by the fully differential operational amplifier.

12. The amplifier circuit of claim 11, wherein the DC source comprises a plurality of individual DC sources coupled electrically in parallel.

13. The amplifier circuit of claim 12, wherein the plurality of individual DC sources comprises a plurality of DC sources that generate approximately equivalent direct currents.

14. The amplifier circuit of claim 12, wherein the plurality of individual DC sources comprises a plurality of DC sources that generate weighted direct currents.

15. The amplifier circuit of claim 12, wherein each of the plurality of individual DC sources is independently selectable.

16. The amplifier circuit of claim 15, further comprising a control bus for selectively coupling one or more of the individual DC sources with the third and fourth resistors.

17. The amplifier circuit of claim 11, wherein the DC source comprises a band-gap voltage referenced current source.

18. The amplifier circuit of claim 11, wherein the band-gap voltage referenced current source comprises:
a band-gap voltage source;
an operational amplifier having a non-inverting input terminal coupled with the voltage source;
a substantially temperature independent precision resistor coupled with an inverting input terminal of the operational amplifier and an electrical ground;
a transconducting device coupled with an output terminal of the operational amplifier and the precision resistor; and
a current mirror circuit coupled with the transconducting device, wherein an output terminal of the current mirror circuit is coupled with the fully differential amplifier.

19. The amplifier circuit of claim 18, wherein the transconducting device comprises a field effect transistor.

20. The amplifier circuit of claim 18, wherein the transconducting device comprises a bipolar junction transistor.

21. A method of shifting a common-mode voltage comprising:
applying a first differential signal to a first non-inverting input of a differential amplifier;
applying a second differential signal to a second non-inverting input of a differential amplifier, wherein the first and second differential signals have a first common-mode voltage;
generating a substantially fixed direct current;
communicating the substantially fixed direct current to the first and second inverting inputs of the differential amplifier in substantially fixed proportions;
producing first and second differential output signals having a second common-mode voltage, wherein the second common-mode voltage differs from the first common-mode voltage by a voltage amount proportional to the substantially fixed direct current.

22. The method of claim 21, wherein generating the substantially fixed current comprises:
applying a band-gap voltage to an amplifier;
applying an output signal of the amplifier to a first semiconductor device coupled with a precision resistor to generate a reference current in a second semiconductor device; and
mirroring the reference current with a third semiconductor device to produce the substantially fixed direct current.

23. The method of claim 22, wherein the first, second and third semiconductor devices comprise first, second and third bipolar-junction transistors (BJTs), the second and third BJTs have substantially the same physical dimensions and electrical characteristics.

24. The method of claim 22, wherein the first, second and third semiconductor devices comprise first, second and third field-effect transistors (FETs), the second and third FETs have substantially the same physical dimensions and electrical characteristics.

25. The method of claim 21, wherein communicating the substantially fixed direct current to the first and second inverting inputs of the differential amplifier in substantially fixed proportions comprises communicating the substantially fixed direct current to the first and second inverting inputs via a resistor divider circuit including a first resistor and a second resistor, the first and second resistors having substantially the same resistance.

26. The method of claim 21, further comprising applying first and second feedback signals to the first and second inverting inputs by applying the first and second output signals, respectively, to the first and second inverting inputs via first and second resistors having substantially the same resistance.

27. The method of claim 21, wherein generating a substantially fixed direct current and communicating the substantially fixed direct current to the first and second inverting inputs of the differential amplifier comprises:

generating plural substantially fixed currents; and communicating the plural substantially fixed currents to the first and second inverting inputs of the differential amplifier via a resistor divider.

28. The method of claim 21, wherein generating the plural substantially fixed currents comprises generating the plural substantially fixed currents using plural direct current sources coupled electrically in parallel, and wherein communicating the plural substantially fixed current to the first and second inverting inputs of the differential amplifier in substantially fixed proportions comprises communicating the plural substantially fixed currents via a first resistor and a second resistor, the first and second resistors having substantially the same resistance.

* * * * *